United States Patent [19]

Feuerbaum et al.

[11] Patent Number: 4,808,821
[45] Date of Patent: Feb. 28, 1989

[54] SPECTROMETER OBJECTIVE FOR ELECTRON BEAM MENSURATION TECHNIQUES

[75] Inventors: Hans-Peter Feuerbaum, Munich; Juergen Frosien, Ottobrunn, both of Fed. Rep. of Germany

[73] Assignee: Siemens Aktiengesellschaft, Berlin and Munich, Fed. Rep. of Germany

[21] Appl. No.: 874,498

[22] Filed: Jun. 16, 1986

[30] Foreign Application Priority Data

Jun. 14, 1985 [DE] Fed. Rep. of Germany ....... 3521464

[51] Int. Cl.$^4$ ............................................. H01J 37/05
[52] U.S. Cl. ................................... 250/305; 250/310; 250/396 ML; 250/397
[58] Field of Search ......... 250/310, 397, 305, 396 ML

[56] References Cited

U.S. PATENT DOCUMENTS 3,930,181 12/1975 Pfeiffer .................. 250/396 ML
4,464,571 8/1984 Plies ................................ 250/305

OTHER PUBLICATIONS

Kawamoto, H., "Electron Beam Tester with in the Lens Analyzer", Proceedings of the Symposium on Electron Beam Testing, Nov. 9-10, 1984, Osaka, Japan.

Primary Examiner—Carolyn E. Fields
Assistant Examiner—John A. Miller
Attorney, Agent, or Firm—Hill, Van Santen, Steadman & Simpson

[57] ABSTRACT

A spectrometer objective is composed of a short focal length, asymmetrical objective lens comprising an integrated electrostatic opposing field spectrometer and a single-stage deflection system arranged within the magnetic lens. Since the deflection of primary electrons occurs within the spectrometer objective, the space for a two-state deflection system employed in conventional systems between a condenser lens and an objective lens can be eliminated. The extremely-short structural length of the electron beam measuring apparatus which is thereby obtainable, in turn, has a beneficial effect on the influence of the lateral Boersch effect on probe diameter, this influence increasing with the length of the electron-optical beam path.

10 Claims, 2 Drawing Sheets

SPECTROMETER OBJECTIVE FOR ELECTRON BEAM MENSURATION TECHNIQUES

BACKGROUND OF THE INVENTION

1. Field of the Invention

The present invention relates to a spectrometer objective for electron beam mensuration techniques for quantative measurements of potential in which an objective lens for focusing a primary electron beam onto a specimen and an electrostatic opposing field spectrometer are provided, the arrangement comprising an electrode arrangement for the extraction of the secondary electrons triggered at the specimen by the primary electron beam and an electrode arrangement for generating an electrical opposing field which retards the secondary electrons from an electron optical unit. A detector arrangement is also provided for documenting the secondary electrons.

2. Description of the Prior Art

Conventional scanning electron microscopes equipped with beam blanking systems and opposing field spectrometers are currently utilized for quantitative measurements of potential at nodes and interconnects in large scale integrated (LSI) circuits. However, adequately fine electron probes for the examination of very large scale integrated (VLSI) circuits having structures in the sub-micrometer range cannot be produced with modified scanning electron microscopes, since these devices must be operated at low primary electron energies in order to avoid radiation damage to and charges at the components that are usually arranged on insulating carrier substances. A noticeable improvement of the spatial resolution that is essentially limited by the axial chromatic aberration of the objective lens and by the electron-electron interaction (Boersch effect) can only be achieved by way of a short electron optical beam path having few beam crossover points and an objective lens having a short focal length. Up to now, the use of short focal length objective lenses for the reduction of the axial chromatic aberration increasing proportionally with the focal length ran aground of the structure of electron beam measuring installations wherein a secondary electron spectrometer is arranged between the objective lens and the specimen.

Only with the development of objective lenses having an integrated secondary electron spectrometer (spectrometer objective) could the aberration of the objective lens be reduced with the working distance and, therefore, the probe diameter diminished in size on the specimen. Such a spectrometer lens is known from the publication of Kawamoto entitled "Electron Beam Tester with In-the Lens-Analyzer", in the Proceedings of the Symposium on Electron-Beam-Testing, November 9-10, 1984, Osaka, Japan, pp. 69-72.

This known arrangement is a matter of a magnetic objective lens having a short focal length and comprising an integrated parallel plate analyzer and an electrode arranged above the objective lens for the deflection of the secondary electrons in the direction of a detector.

Although the diameter of the electron probe on the specimen can be noticeably reduced in comparision to conventional arrangements when an electron beam measuring apparatus equipped with the known spectrometer lens is used, the spatial resolution of these devices remains limited. The reason for this is the Coulomb repulsion of the electrons in the beam path between the electron source and the specimen, this Coulomb repulsion opposing a focusing of the electron beam.

SUMMARY OF THE INVENTION

The object of the present invention is to provide a spectrometer lens of the type set forth above with which the electron optical beam path between the beam generator and the specimen can be shortened and, therefore, the influence of the Boersch effect on the probe diameter can be noticeably reduced.

The above object is achieved with a spectrometer objective of the type set forth above which is particularly characterized in that a deflection system is provided within a magnetic objective lens having a short focal length, the deflection system being arranged symmetrically relative to the optical axis and between the electrode arrangement for the extraction of the secondary electrons triggered as the specimen is radiated and the electrode arrangement for generating the opposing field which retards the secondary electrons.

The advantage which is obtained in practicing the present invention is particularly that the spatial resolution and the resolution of potential of an electon beam measuring apparatus can be noticeable enhanced, even at high probe currents. According to the invention, the deflection of the primary electrons occurs within the spectrometer lens, so that the space for the two-stage deflection systems used in conventional arrangements between a condenser lens and an objective lens can be eliminated. The extremely short structural length of the electron beam measuring apparatus, which is thereby obtainable, in turn, has a favorable effect on the influence on the lateral Boersch effect on the probe diameter, this influence increasing with the length of the beam path. According to a particular feature of the invention, a single-stage deflection system may be provided.

According to another feature of the invention, the electrode arrangement for generating an electrical opposing field comprises two spherical-symmetrical electrodes arranged immediately above the objective lens and whose potential are selected such that a spherical-symmetrical opposing field is built up in the space between the electrodes, the centers of the spherical-symmetrical electrodes coinciding at a point lying on the optical axis within the objective lens. According to this feature, the aforementioned point lies in the center of the deflection system in a spatial region which is free of electrical fields, and the secondary electrons triggered at the specimen are focused in the field of the objective lens at a point lying on the optical axis within the spectrometer objective.

According to another feature of the invention, for generating a space within the objective lens that is free of electrical fields, a hollow cylinder is arranged concentric with the optical axis, the hollow cylinder conductively connecting a planar extraction electrode lying above the specimen and at a high positive potential and the spherical-symmetrical electrode lying closest to the specimen to one another.

According to another feature of the invention, an electrical immersion lens is provided for the extraction and acceleration of the secondary electrons triggered at the specimen.

According to another feature of the invention, a plurality of detectors is provided for documenting the secondary electrons and are arranged above the spherical-symmetrical gridshaped electrodes, being arranged symmetrically relative to the optical axis.

According to another feature of the invention, a grid electrode is provided and lies at a negative potential for the deflection of the secondary electrons emitted in the direction of the optical axis, the grid electrode being provided above the spherical-symmetrical electrodes.

BRIEF DESCRIPTION OF THE DRAWINGS

Other objects, features and advantages of the invention will be best understood from the following detailed description taken in conjunction with the accompanying drawings, on which.

DESCRIPTION OF THE PREFERRED EMBODIMENTS

Figure 1:
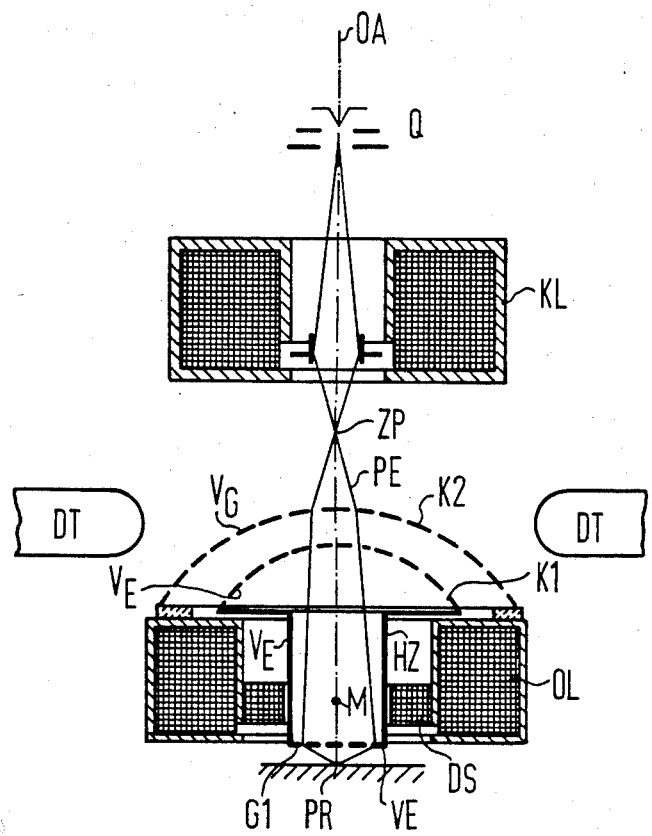
FIG. 1 is a sectional view of an apparatus constructed in accordance with a first embodiment of the invention.
Figure 2:
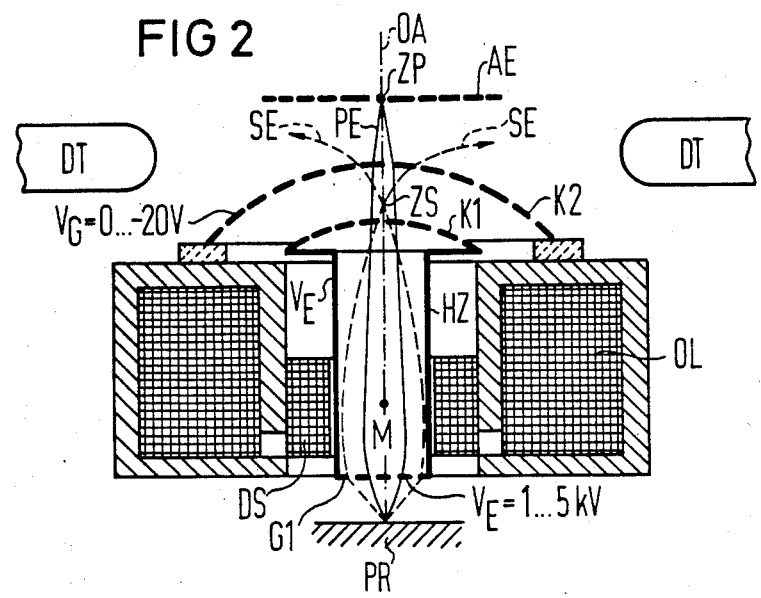
FIG. 2 is a sectional view of apparatus constructed in accordance with a particular embodiment of the invention.

The exemplary embodiment of the spectrometer objective constructed in accordance with the present invention and shown in FIGS. 1 and 2 is composed of a short focal length, largely asymmetrical objective lens OL having an integrated, electrostatic opposing field spectrometer and a single-stage, magnetic deflection system DS arranged within the magnetic lens OL symmetrical to the optical axis OA. This overall system forms an electron-optical unit with which, for example, both the primary electrons PE generated in a high-current electron source Q and the secondary electrons SE triggered at a specimen PR can be focused at a point lying on the optical axis OA. For generating a fine electron probe, the electron source Q or the intermediate image ZP of the electron source Q, demagnified by a condensner lenses KL, is imaged, again demagnified, onto a specimen PR arranged in the immediate proximity of the rear focal plane of the objective lens OL, being imaged thereon with the assistance of the spectrometer objective lenses having short focal lengths offers a number of advantages. As a result of high objective demagnification can be achieved given focal length beteween 3 mm and 12 mm, the required system demagnification can be realized by a short beam path. A short beam path, however, is of decisive significance precisely for a reduction of the disadvantageous influences of the electron-electron interaction on the probe diameter. In addition, objective lenses having a short focal length are particularly distinguished by smaller axial chromatic and spherical aberrations that increase with the focal length.

For the documentation of low-energy secondary electrons SE triggered at the measuring location by the high-energy primary electrons PE as a result of their interaction with the solid state substance and emitted in a large solid angle region above the specimen PR, the secondary electrons SE are extracted in the electrical field of a grid electrode G1 which lies at a high positive potential $V_E$ob between 1 kV and 5 kV and are accelerated in the direction of the optical axis OA. The secondary electrons SE traverse this planar grid electrode G1 with high energies and are focused in the magnetic field of the objective lens OL, being focused at a point ZS lying on the optical axis OA within the spectrometer objective. The position of the focusing point ZS is defined by the magnitude of the voltage $V_E$ of the grid electrode G1 and by the strength of the magnetic field between the pole shoes of the objective lens OL which is dependent on the primary electron energy. The common focusing of all secondary electrons SE in the field of the objective lens OL is only possible at all due to their acceleration to high kinetic energies, since only then is the relative energy width $\Delta E/\overline{E}$ ($\overline{E}$ being the mean kinetic energy of the secondary electrons) reduced to such a degree that the image distances of the secondary electrons SE emitted with different energies E at the measuring location still nearly coincide. Since, given high extraction voltages $V_E$, the primary electrons PE also traverse the objective lens OL with high energies, the disadvantageous influence of the Boersch effect on the probe diameter is also reduced in this portion of the beam path. As a result of the superposition of the focusing magnetic field of the objective lens and of the focusing magnetic field of the objective lens and of the electrical field of the extraction electrode G1 which decelerates the primary electrons PE, the spherical and chromatic aberrations of the magnetic lens OL are also reduced.

The deceleration and energy analysis of the secondary electrons SE occurs immediately above the objective lens OL in a, preferably, spherical-symmetrical electrical opposing field that is built up in the spatial region between two spherical-symmetrical grid-shaped electrodes K1 and K2 which lie at different potentials $V_E$ and, respectively, $V_G$. Such electrode arrangements are known, for example, from the U.S. Pat. No. 4,464,571, fully incorporated herein by this reference.

For the purpose of generating a space within the objective lens OL that is free of electrical fields, the lower, spherical-symmetrical grid-shaped electrode K1 is conductively connected to the extraction electrode G1 via a hollow cylinder HZ arranged concentrically with the optical axis OA. The potential $V_G$ of the upper grid-shaped electrode K2, acting as an opposing field grid, is determined by the specimen potential and typically lies beween 0 volts and −20 volts.

Since both the primary electrons PE and the secondary electrons SE emitted from the specimen PR and accelerated in the field of the extraction electrode G1 are deflected by the integrated deflection system DS, care must be taken to see that the secondary electron trajectories proceed as parallel as possible to the electrical field lines of the opposing field and, therefore, perpendicular to the surface of the spherical-symmetrical grid-shaped electrode K1 and K2. This condition is always met for the central beam of the secondary electron lobe when the common center of the spherical-symmetrical grid shaped electrodes K1 and K2 lies on the optical axis OA in the center of the deflection system DS. Since, when scanning the electron probe, the secondary electron lobe is tilted about the center of the deflection system DS, a location-independent and angle-independent documentation of the secondary electrons SE emitted in the direction of the symmetrical axis of the lobe is possible with one or more detectors DT arranged symmetrically relative to the optical axis OA. Given a symmetrical arrangement of the detectors DT which are composed, for example, of a shielding lattice, a scintillator and a light conductor, a grid AE for the deflection of the secondary electrons SE emitted in the direction of the optical axis OA can also be provided above the spherical-symmetrical grid-shaped electrodes K1 and K2, the grid AE lying at a negative potential.

Figure 3:
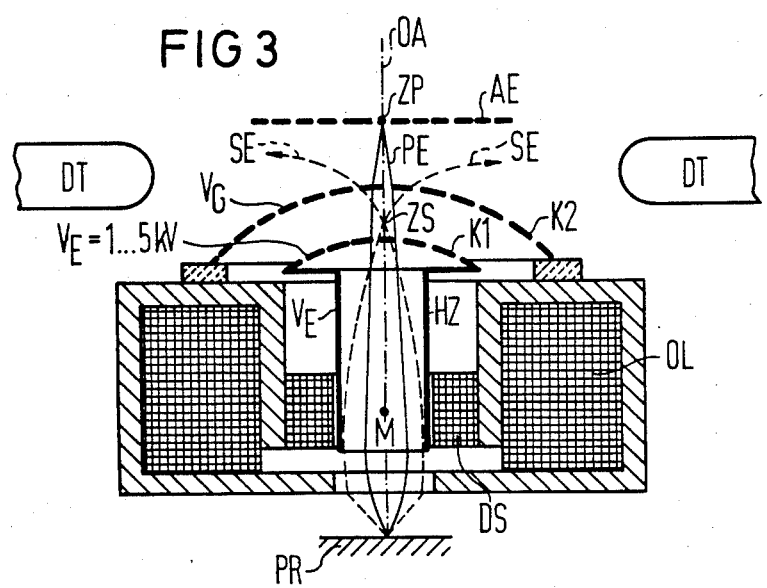
FIG. 3 is a sectional view of apparatus constructed in accordance with a particular embodiment of the invention.

The exemplary embodiment of a spectrometer objective illustrated in FIG. 3 is composed of a short-focal length magnetic objective lens OL having an integrated electrostatic opposing field spectrometer and a single-stage deflection system DS arranged within the magnetic lens OL. The extraction and acceleration of the secondary electrons SE, differing from the exemplary embodiment of FIGS. 1 and 2, thereby occurs in the field of an electrostatic immersion lens which is composed of the spherical-symmetrical grid-shaped electrode K1, the hollow cylinder HZ arranged concentric with the optical axis OA and the pole shoes of the objective lens OL, the pole shoes lying at ground potential. This combination of a magnetic lens with a superimposed electrical immersion lens is distinguished by more favorable chromatic aberrations when compared to arrangements having only a magnetic lens.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution art.

We claim:

1. A spectrometer objective for particle beam measuring instruments, comprising:
   a magnetic lens for receiving and focusing a beam of primary electrons along an optical axis onto a specimen to cause emission of secondary electrons;
   a deflection system arranged within said magnetic lens;
   a first electrode means for accelerating the secondary electrons triggered at the specimen in the direction of said magnetic lens;
   a second electrode means comprising a first electrode and a second electrode;
   said first electrode forming a part of the surface of a first sphere having a first radius and said second electrode forming a portion of the surface of a second sphere having a second radius;
   said first sphere and said second sphere having a common center which lies on the optical axis within said magnetic lens in a region free of electrical fields;
   said common center of said first and second spheres lying in the middle of said deflection system;
   means for charging said first and second electrodes with potentials such that an electrical field decelerating the secondary electrons builds up in the spatial region between said first and second electrodes; and
   a detector system for detecting the secondary electrons, said detector system assigned to said second electrode means.

2. The spectrometer objective of claim 1, wherein: a hollow cylinder is arranged concentrically with said optical axis and electrically connects said first electrode means to said first electrode of said second electrode means, said first electrode being closer to the specimen than said second electrode.

3. The spectrometer objective of claim 1, wherein: said second electrode means is arranged immediately above said magnetic lens.

4. The spectrometer objective of claim 1, wherein: said deflection system comprises a single-stage deflection system.

5. The spectrometer objective of claim 1, wherein: a hollow cylinder is arranged concentrically relative to the optical axis within said magnetic lens, said magnetic lens including a lower pole shoe and said hollow cylinder electrically connected to the one of said first or second electrode of said second electrode means which is nearer the specimen; said hollow cylinder extending down into the region of said lower pole shoe of said magnetic lens, wherein said pole shoe lies at a different potential than said hollow cylinder.

6. The spectrometer objective of claim 1, wherein: said detector system comprises a plurality of detectors symmetrically disposed about the optical axis.

7. The spectrometer objective of claim 1, and further comprising:
   a grid electrode arranged adjacent said second electrode means opposite said objective lens for connection to a negative potential to deflect the secondary electrons.

8. A spectrometer objective for particle beam measuring instruments, comprising:
   a magnetic objective lens for receiving and focusing a primary electron beam therethrough onto a specimen along an optical axis to cause emission of secondary electrons;
   a first electrode means along the optical axis adjacent said magnetic objective lens and energizable to extract the secondary electrons;
   a second electrode means concentric with and adjacent said magnetic objective lens opposite said first electrode means and energizable to retard the secondary electrons;
   detector means adjacent said second electrode means for detecting the secondary electrons;
   deflection means within said magnetic objective lens mounted symmetrical with respect to the optical axis and between said first and second electrode means and operable to provide a short focal length; and
   means for producing a space within said magnetic objective lens which is free of electrical fields, said means for producing including a hollow cylinder concentric with the optical axis and mounted within said magnetic objective lens and electrically connected to said first and second electrode means;
   said second electrode means comprising a first electrode and a second electrode, said first and second electrodes charged with potentials such that an electrical field decelerating the secondary electrons builds up in the spatial region between the electrodes, said first electrode forming a part of the surface of a first sphere having a first radius and said second electrode forming a part of the surface of a second sphere having a second radius, said first sphere and said second sphere having a common center which lies on the optical axis within said magnetic lens in a region free of electrical fields, said common center of said deflection means.

9. A spectrometer objective for particle beam measuring instruments, comprising:
   a magnetic objective lens for receiving and focusing a primary electron beam therethrough onto a specimen along an optical axis to cause emission of secondary electrons;

first electrode means arranged on the optical axis adjacent said magnetic objective lens and energizable to extract the secondary electrons;

second electrode means concentric with and adjacent said magnetic objective lens opposite said first electrode means and energizable to retard the secondary electrons;

detector means adjacent said second electrode means for detecting the secondary electrons; and deflection means within said magnetic objective lens mounted symmetrical with respect to the optical axis and between said first and second electrode means, and operable to provide a short focal length;

said second electrode means comprising first and second spacedapart spherical-symmerical electrodes charged at respective potentials such that a spherical symmetrical opposing field is established between said first and second electrodes, said first and second electrodes including a common center point on the optical axis and within said deflection means so that the secondary electrons are focused on a point on the optical axis within said magnetic objective lens.

10. A spectrometer objective for particle beam measuring instruments, comprising:

a magnetic objective lens for receiving a primary electron beam therethrough and focusing the same onto a specimen along an optical axis to cause the emission of secondary electrons;

first electrode means on the optical axis adjacent said magnetic objective lens and energizable to extract the secondary electrons;

second electrode means adjacent said objective lens opposite said first electrode means and energizable to retard the secondary electrons;

detector means adjacent said second electrode means for detecting the secondary electrons;

deflection means within said magnetic objective lens mounted symmetrically with respect to the optical axis and between said first and second electrode means and operable to provide a short focal length;

said second electrode means comprising first and second spaced-apart spherical-symmetrical electrodes charged at respective potentials such that a spherical symmetrical opposing field is established between said first and second electrodes, said first and second electrodes including a common center point on the optical axis within said deflection means so that the secondary electrons are focused on a point on the optical axis within said magnetic objective lens;

an electrical immersion lens means, including said second electrode means, for extracting and accelerating secondary electrons; and a grid electrode means arranged adjacent said second electrode means opposite said magnetic objective lens for connection to a negative potential to deflect the secondary electrons.

* * * * *